HIGH-FREQUENCY WAVE-SIGNAL TUNING DEVICE

Filed June 25, 1951 2 Sheets-Sheet 1

INVENTOR.
SAMUEL RUBIN
BY Laurence B. Dodds
INVENTOR

*INVENTOR.*
SAMUEL RUBIN
*BY* Laurence B. Dodds
INVENTOR

United States Patent Office 2,787,705
Patented Apr. 2, 1957

2,787,705

HIGH-FREQUENCY WAVE-SIGNAL TUNING DEVICE

Samuel Rubin, Long Island City, N. Y., assignor to Hazeltine Research, Inc., Chicago, Ill., a corporation of Illinois Application June 25, 1951, Serial No. 233,455

6 Claims. (Cl. 250—20)

*General*

Figure 1:
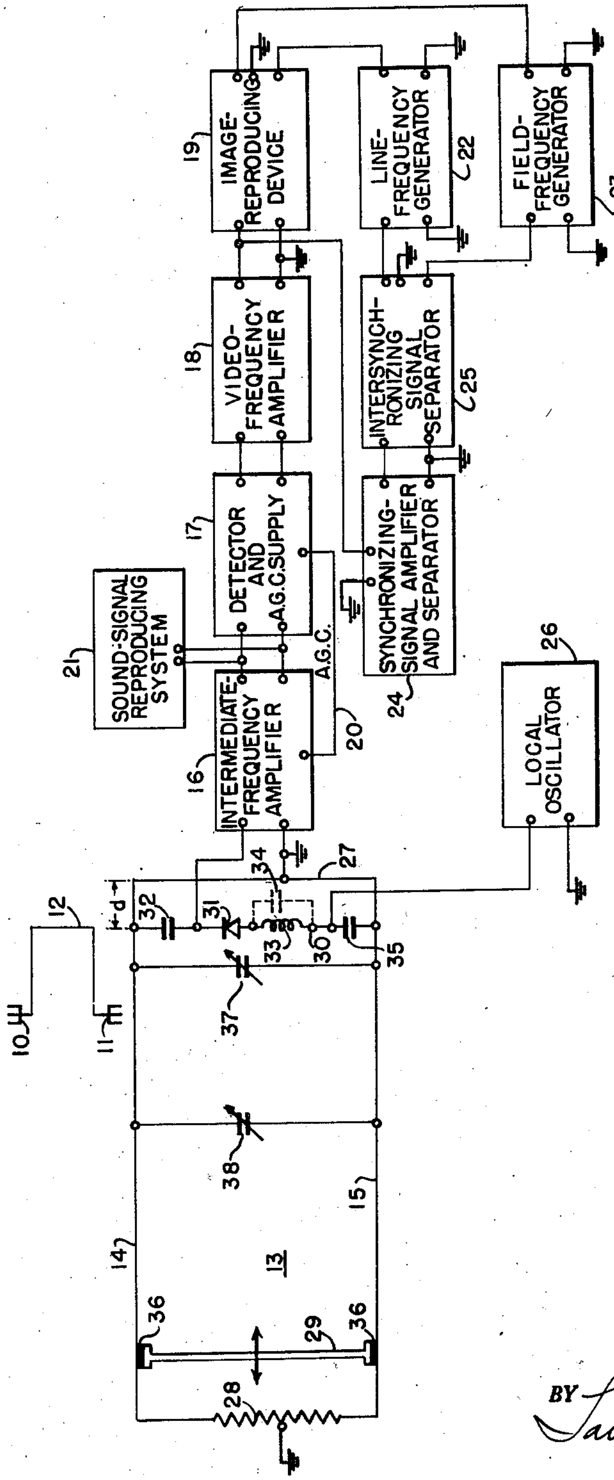

The present invention relates to high-frequency wave-signal tuning devices and, more particularly, to such devices of the transmission-line type in which the effective electrical lengths of the transmission lines thereof are altered to effect tuning over a selected range of frequencies. As used herein a "transmission line" is meant to include any wave-signal translating device utilizing two conductors for translating wave signals therealong. The invention is especially directed to a tuning device which has a pass band of substantially constant width over the selected frequency range. Such a tuning device has particular utility in an ultra-high-frequency television receiver and, hence, will be described in that environment.

This application is a continuation-in-part of application Serial No. 167,345, filed June 10, 1950, and entitled "Tuning Device", now abandoned.

Heretofore, tuning devices for ultra-high-frequency equipment generally have had relatively narrow pass bands. An ultra-high-frequency superheterodyne television receiver, however, usually requires a tuning device having at each received signal frequency a pass band sufficiently wide to allow the reception of all the signal components necessary faithfully to reconstruct a televised picture. These television receivers also ordinarily require a tuning device having at each received signal frequency a pass band sufficiently narrow to reduce spurious responses such as responses to undesired image-frequency signals. Accordingly, it is usually desirable that the pass band of a tuning device for such a receiver have a predetermined or optimum width at each received signal frequency. This optimum width of the pass band is ordinarily substantially the same at all received signal frequencies. Hence, it is desirable that the pass band of such a tuning device have a substantially constant width over the selected range of received signal frequencies.

Tunable transmission lines are particularly useful in these ultra-high-frequency tuning devices. However, under operating conditions in which a suitable load circuit is coupled at a fixed position along a transmission line, the pass band of the line ordinarily increases in width as the transmission line is tuned to a higher frequency. This change in the width of the pass band results from the change in the voltage and current distribution on the transmission line as the effective electrical length thereof is altered. Accordingly, such tuning devices have not been entirely satisfactory for some applications in which it is desirable that the pass bands of the devices have substantially constant widths.

Additionally, in a tuning device utilizing a resonant high-impedance transmission line having a characteristic impedance of the order of 125 ohms, to prevent the pass band from having excessive widths at all frequencies in the tuning range, it is ordinarily necessary physically to couple the load circuit so close to the short-circuited end of the transmission line that its position is more critical than is desirable.

It is an object of the present invention, therefore, to provide a new and improved high-frequency wave-signal tuning device which avoids one or more of the above-mentioned disadvantages of prior such systems.

It is another object of the invention to provide a relatively simple high-frequency wave-signal tuning device in which variations in the width of the pass band of the device are substantially reduced over a selected frequency range.

It is a further object of the invention to provide for use in a television receiver an improved high-frequency wave-signal tuning device which has a pass band of substantially constant width over a wide frequency range.

In accordance with a particular form of the invention, a high-frequency wave-signal tuning device tunable to each of a plurality of frequencies in a selected range of frequencies comprises a transmission line having an effective electrical length approximately equal to an integral multiple of one-quarter wave length at a predetermined frequency in the aforesaid range. The device also includes adjustable tuning means for selectively adjusting at each position thereof the effective electrical length of the transmission line to substantially the aforesaid multiple of one-quarter wave length at one of the plurality of frequencies in the above-mentioned range. The device also includes a load impedance network coupled to the transmission line at an intermediate point thereof and including a primarily resistive first impedance means and a resonant circuit additional to said transmission line and comprising a self-resonant inductor resonant at a frequency above said selected range and having a substantial primarily reactive impedance over at least a portion of the above-mentioned range. The network is coupled across the line and is included in the active portion of the transmission line over the entire range. The resonant circuit is proportioned with relation to the first impedance means substantially to reduce percentage variations in the width of the pass band of the device over the selected frequency range.

Also in accordance with the invention, a high-frequency wave-signal tuning device tunable over a selected frequency range comprises a high-frequency wave-signal transmission line and means for tuning the transmission line over a selected frequency range. The device also includes primarily resistive load impedance means coupled to the transmission line at frequencies in the selected range and a resonant circuit additional to the transmission line and coupled to the line and to the load impedance means and having a substantial primarily inductive impedance over the range for decreasing the coupling of the load impedance means to the transmission line at the higher frequencies of the range substantially to reduce percentage variations in the width of the pass band of the device over the selected frequency range.

For a better understanding of the present invention, together with other and further objects thereof, reference is had to the following description taken in connection with the accompanying drawings, and its scope will be pointed out in the appended claims.

Figure 3:
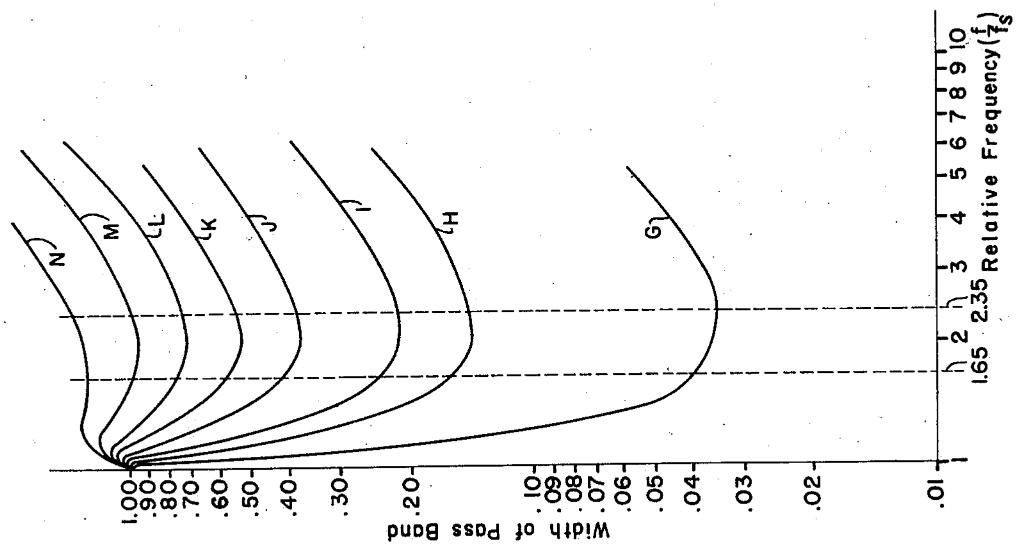
Figure 2:
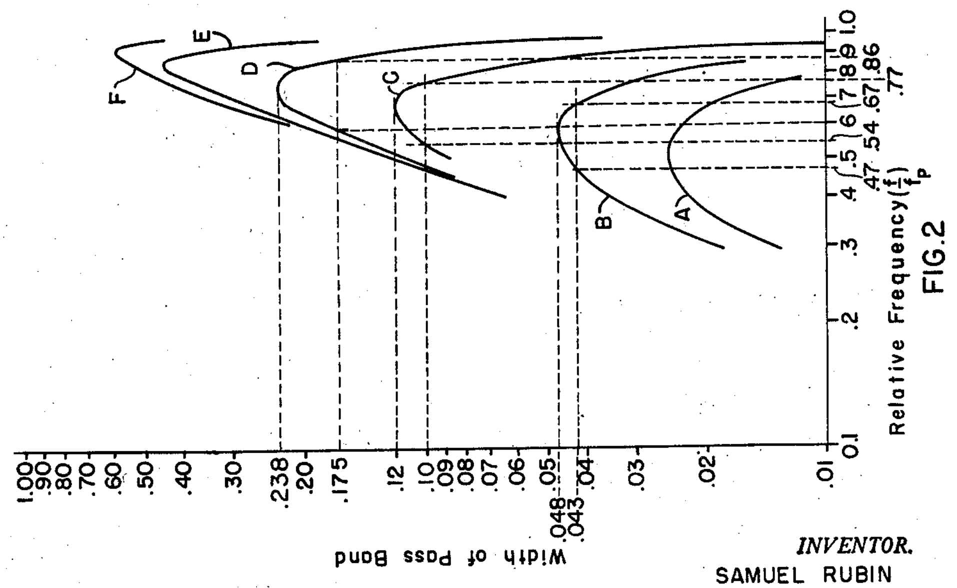

In the accompanying drawings, Fig. 1 is a circuit diagram, partly schematic, of a complete television receiver including a tuning device in accordance with a particular form of the invention; and Figs. 2 and 3 are graphs utilized in explaining the operation of the tuning device of the Fig. 1 receiver.

*Description of Fig. 1 receiver*

Referring now more particularly to Fig. 1 of the drawings, the television receiver there represented preferably is adapted to receive wave signals in the ultra-high-frequency band. The receiver comprises an antenna system 10, 11 coupled through a coupling loop 12 to a tuning device 13 which includes a tunable transmission line 14, 15. The tuning device 13 is constructed in accordance with the invention and will subsequently be described in greater detail, but it will be noted that the device includes a suitable mixer 31.

The device 13 is coupled in cascade and in the order named to an intermediate-frequency amplifier 16 of one or more stages, a detector and automatic-gain-control or A. G. C. supply 17, a video-frequency amplifier 18 of one or more stages and an image-reproducing device 19 which may comprise a cathode-ray tube. The intermediate-frequency amplifier 16 is tuned to an intermediate frequency of, for example, 40 megacycles. The A. G. C. supply of unit 17 is conneected to the input circuits of one or more of the intermediate-frequency amplifier stages by a control-circuit conductor 20. Connected to the output terminals of the intermediate-frequency amplifier 16 is a conventional sound-signal reproducing system 21 which comprises the usual sound intermediate-frequency amplifier, frequency detector, audio-frequency amplifier and loudspeaker.

The output circuit of the video-frequency amplifier 18 is coupled to the input circuit of a line-frequency generator 22 and a field-frequency generator 23 through a synchronizing-signal amplifier and separator 24 and an intersynchronizing-signal separator 25. The output circuits of the generators 22 and 23 are coupled in a conventional manner to scanning circuits of the image-reproducing device 19.

The television receiver also includes a local oscillator 26 which is coupled to the tuning device 13 and which includes a suitable circuit for allowing direct current to flow through the output terminals of the oscillator. The antenna system 10, 11, coupling loop 12 and units 16–19, inclusive, and 21–26, inclusive, may be of conventional construction and operation so that a detailed description and explanation of the operation thereof are unnecessary herein.

*General operation of Fig. 1 receiver*

Considering briefly, however, the general operation of the above-described receiver as a whole, television signals intercepted by the antenna system 10, 11 are selected by the transmission line 14, 15 and are heterodyned in the mixer 31 of the tuning device 13 with the output signal of the local oscillator 26 which is capable of delivering heterodyne-signal energy across a relatively low output-circuit impedance. The television signals are thereby converted to 40 megacycle intermediate-frequency signals. The latter in turn are selectively amplified in the intermediate-frequency amplifier 16 and applied to the detector and automatic-gain-control supply 17. The video-frequency modulation components of the intermediate-frequency signals are derived by the detector of unit 17 and are supplied to the video-frequency amplifier 18, wherein they are amplified and from which they are applied to the input circuit of the image-reproducing device 19. A control voltage derived by the automatic-gain-control supply of the unit 17 is applied as an automatic-amplification-control bias to the gain-control circuits of the intermediate-frequency amplifier 16 to maintain the input signal to the detector of unit 17 within a relatively narrow amplitude range for a wide range of received signal intensities.

The unit 42 selects the synchronizing signals from the other modulation components of the composite television signal applied thereto by the video-frequency amplifier 18. The line-synchronizing and field-synchronizing signals derived by the separator 24 are separated from each other by the unit 25 and are then supplied to individual ones of the generators 22 and 23 to synchronize the operation thereof. Saw-tooth signals are generated in the line-frequency and field-frequency generators 22 and

23 and are applied to the scanning circuits of the image-reproducing device 19, thereby to deflect the cathode-ray beam of the device 19 in two directions normal to each other to trace a rectilinear scanning pattern on the display screen of the device and thus reconstruct the translated picture.

The sound intermediate-frequency signal is amplified in the unit 21 and the audio-frequency modulation components thereof are derived and converted to sound in a conventional manner.

*Description of Fig. 1 tuning device*

Referring now more particularly to the tuning device 13 which embodies the present invention, the device is tunable to each of a plurality of frequencies in a selected range of frequencies and comprises a high-impedance transmission line including the pair of elongated conductors 14, 15 which preferably are flat, relatively thin metallic strips disposed in a coplanar, substantially parallel relation. A conductor 27 provides a low-impedance termination for the transmission line 14, 15 at one end thereof. A resistor 28 of suitable value is coupled between the conductors 14 and 15 at the other end of the transmission line and is center-tapped to ground to suppress undesirable modes of resonance.

The transmission line 14, 15 has an effective electrical length approximately equal to an integral multiple of one-quarter wave length at a predetermined frequency in the selected range of frequencies. As used throughout the specification and the claims, the term "integral multiple" is employed in its usual sense to mean the product of a quantity by an integer including the product obtained by multiplying that quantity by unity. The effective electrical length of the transmission line 14, 15 preferably is approximately equal to one-half wave length at the lowest frequency in the selected range.

The characteristic impedance of the transmission line 14, 15 ordinarily is of the order of 125 ohms and the Q of the transmission line preferably is much greater than unity, that is, of the order of 30 under normal load conditions. The Q of the transmission line under no-load conditions will usually be much greater than the Q under load conditions.

The tuning device 13 also includes adjustable tuning means 29 which preferably is displaceable relative to the transmission line 14, 15 for selectively adjusting at each position thereof the effective electrical length of the transmission line 14, 15 to substantially the aforesaid multiple of one-quarter wave length, namely one-half wave length, at one of the plurality of frequencies in the selected range. More particularly, the tuning means 29 preferably comprises a metallic strip separated from the flat surfaces of the conductors 14 and 15 by thin strips 36, 36 of suitable dielectric material and displaceable longitudinally of the conductors 14 and 15 over a limited distance therealong. The tuning means 29, therefore, is effective to provide a low-impedance termination for the transmission line 14, 15 at each position of adjustment thereof.

The tuning device 13 also includes means coupled to the transmission line 14, 15 for applying a received wave signal thereto. Specifically, this means comprises the coupling loop 12. The device 13 additionally includes means coupled to the transmission line 14, 15 for applying a heterodyning wave signal thereto. More particularly, this means comprises a terminal 30 and also may include output-circuit components of the local oscillator 26.

The tuning device 13 further comprises an impedance network, specifically a load circuit, coupled to the transmission line 14, 15 at an intermediate point thereof near the terminating conductor 27. The positioning of the impedance network will be more fully described hereinafter. The impedance network includes a first impedance means having a primarily resistive impedance and also includes a second impedance means having a substantial primarily reactive impedance over at least a portion of the selected range of frequencies. The impedance network further includes means for deriving a resultant output or intermediate-frequency signal from the signals applied to the transmission line 14, 15.

More particularly, the first impedance means comprises a semiconductive crystalline element or crystal mixer 31 and, in addition, may include such other energy-dissipating impedance as may be effectively coupled to the transmission line 14, 15 by the impedance network. The second impedance means is effectively coupled in series relation with the first impedance means and comprises a condenser 32, coupled between the conductor 14 and one electrode of the crystal mixer 31 and also connected to the input circuit of the intermediate-frequency amplifier 16, an inductor 33, coupled between the other electrode of the crystal mixer 31 and the terminal 30, and a condenser 34, coupled in parallel relation with the inductor 33 and shown in broken-line construction since it may comprise in whole or in part the distributed capacitance between the turns of the inductor 33 and other capacitances affecting the impedance across the terminals of the inductor. The second impedance means also includes a condenser 35 coupled between the terminal 30 and the conductor 15 and may additionally include any means which causes a substantial reactive impedance effectively to be coupled to the transmission line 14, 15 by the impedance network over at least a portion of the selected range of frequencies.

The condenser 32, which is also included in the above-mentioned means for deriving an intermediate-frequency signal from the device 13, ordinarily has a low impedance at each of the frequencies in the selected range but may, if desired, have a high reactive impedance over at least a portion of the selected range.

The parallel circuit including the inductor 33 and the condenser 34 preferably comprises a self-resonant inductor which is resonant at a frequency above the selected frequency range. By the term "self-resonant inductor" is meant an inductor which utilizes distributed capacitance effectively across its terminals to resonate at such a frequency that over a portion of the selected frequency range the impedance of the inductor corresponds to the impedance of a parallel-resonant circuit operated in the vicinity of resonance. In other words, the resonant frequency of the self-resonant inductor 33 preferably is such that the inductor has at each of the plurality of frequencies in the selected range a substantial inductive reactance which changes more rapidly than linearly with changes in the operating frequency of the device 13. The resonant frequency of the inductor 33 preferably is appreciably higher than the highest frequency in the selected range. For example, the difference between the resonant frequency of the inductor 33 and the highest frequency in the selected range may be approximately thirty percent of the highest frequency in the selected range. The reactance of the self-resonant inductor preferably is of the order of magnitude of the resistance of the crystal mixer 31 over the selected range of operating frequencies.

The condenser 35 ordinarily has a low impedance at each of the frequencies in the selected range effectively to present a low impedance across the output circuit of the local oscillator 26 and thus minimize losses of received signal energy due to dissipation thereof by the local oscillator 26. For some applications, however, it may be desirable that the condenser 35 have a high reactive impedance over at least a portion of the selected range.

The second impedance means is so proportioned with relation to the first impedance means and the aforesaid intermediate point of coupling between the impedance network and the transmission line 14, 15 is so determined as substantially to reduce variations in the width of the pass band of the device 13 over the selected frequency range. More particularly, the resonant circuit comprising the inductor 33 and the condenser 34 is so proportioned with relation to the impedance of the crystal mixer 31 that the device 13 has a pass band having an approximately constant width over the selected frequency range.

In an alternative arrangement, the second impedance means may comprise a series-resonant circuit. In such an arrangement the values of the condensers 32 and 35 may be sufficiently small to present a high reactive impedance over the selected frequency range and the inductor 33 may be so selected that the distributed capacitance thereof has relatively little effect on the impedance of the inductor over the selected frequency range. The series-resonant circuit preferably is resonant at a frequency below the selected frequency range to present an inductive reactance over the selected range.

Equations governing the proportioning of the second impedance means have been derived under the assumption that the resistance of the crystal mixer 31 is at least of the order of the reactance of the second impedance means and that the transmission line 14, 15 when loaded and when unloaded has a Q of the magnitudes mentioned previously. It may then readily be shown that the Q of the transmission line 14, 15 when loaded and when operating at a frequency of $f$ cycles per second may be expressed:

$$Q=\frac{2\pi fE}{P} \qquad (1)$$

where $E$=instantaneous maximum energy stored in the tuning device 13 expressed in watt-seconds $P$=average power loss in the tuning device 13 expressed in watts.

It also is well known that the width $w$ of the pass band of such a tuning device expressed in cycles per second at a level three decibels below the maximum signal amplitude developed in the device may be written:

$$w=\frac{f}{Q} \qquad (2)$$

From Equations 1 and 2 by the use of well-known transmission-line theory, the following relation may be derived:

$$w=\frac{f}{n\pi}\left[\frac{R_{31}Z_0}{R_{31}^2+X^2}\right]\left[\sin\frac{2\pi f}{v}d\right]^2 \qquad (3)$$

where $R_{31}$=resistance of the first impedance means (the crystal mixer 31) expressed in ohms $Z_0$=characteristic impedance of the transmission line 14, 15 expressed in ohms $X$=reactance at the frequency $f$ of the second impedance means expressed in ohms $d$=distance along the transmission line 14, 15 between the conductor 27 and the position of the impedance network expressed in centimeters $v$=velocity of propagation of wave-signal energy along the transmission line 14, 15 expressed in centimeters per second $n$=number of wave lengths in the transmission line 14, 15 at the frequency $f$ (dimensionless).

In the event that the second impedance means comprises a parallel-resonant circuit, the reactances of the condensers 32 and 35 being comparatively small and the distance $d$ being selected as small relative to a wave length at the frequency $f$, Equation 3 may be expressed in the form:

$$w=\left[\frac{4\pi d^2 Z_0 f_p^3}{nv^2 R_{31}}\right]\left[\frac{\left(\frac{f}{f_p}\right)^3}{1+\left[\left(\frac{\sqrt{\frac{L_{33}}{C_{34}}}}{R_{31}}\right)\left(\frac{1}{\frac{f}{f_p}-\frac{f_p}{f}}\right)\right]^2}\right] \quad (4)$$

where $L_{33}$=inductance of the inductor 33 expressed in henries
$C_{34}$=capacitance of the condenser 34 expressed in farads
$f_p$=resonant frequency of the inductor 33 and the condenser 34 expressed in cycles per second.

On the other hand, when the second impedance means comprises a series-resonant circuit, the reactance of the condenser 34 being comparatively large and the distance $d$ being selected as small relative to a wave length at the frequency $f$, Equation 3 may be expressed in the form:

$$w=\left[\frac{4\pi d^2 Z_0 f_s^3}{nv^2 R_{31}}\right]\left[\frac{\left(\frac{f}{f_s}\right)^3}{1+\left[\left(\frac{\sqrt{\frac{L_{33}}{C_e}}}{R_{31}}\right)\left(\frac{f}{f_s}-\frac{f_s}{f}\right)\right]^2}\right] \quad (5)$$

where $C_e$=effective capacitance of the series combination of the condensers 32 and 35 expressed in farads
$f_s$=resonant frequency of the inductor 33 and the condensers 32 and 35 expressed in cycles per second.

The tuning device 13 also includes condensers 37 and 38 which have values of impedance so selected as to provide a desired tuning characteristic for the device 13. The condensers 37 and 38 are positioned along the transmission line 14, 15 intermediate the tuning means 29 and the conductor 27. The positioning and proportioning of these condensers are disclosed in detail in the copending application of Charles J. Hirsch and Meyer Press, Serial No. 157,058, filed April 20, 1950, and entitled "High-Frequency Wave-Signal Tuning Device."

*Operation of Fig. 1 tuning device*

More clearly to understand the operation of the tuning device 13, there will briefly be considered the construction and operation of the device when the mixer 31 and the condensers 32 and 35 are coupled to the transmission line 14, 15 in a conventional manner. When the device 13 is constructed in a conventional manner, the inductor 33 and the condenser 34 are omitted from the tuning device 13; each of the condensers 32 and 35 has a low value of impedance at each of the frequencies in the selected range; and the mixer 31 and the condensers 32 and 35 are coupled to the transmission line 14, 15 nearer the conductor 27 than is represented in Fig. 1 or, for example, approximately .015 wave length therefrom at a mid-frequency in the selected frequency range. For the purpose of this explanation, it will be assumed tthat a signal of predetermined signal strength is applied from the local oscillator 26 to the terminal 30 and that the antenna system 10, 11 is loosely coupled to the transmission line 14, 15. It has been found that under these operating conditions, the width of the pass band of the device 13 is approximately proportional to the cube of the operating frequency thereof.

To compensate the undesired increase in the width of the pass band of the tuning device 13 and provide a pass band of substantially constant width, the parallel-resonant circuit comprising the inductor 33 and the condenser 34 may be proportioned in a manner presently to be explained and coupled to the transmission line 14, 15 at a distance $d$ from the conductor 27 as represented in Fig. 1.

Referring now to Fig. 2 of the drawings, the graph represents pass-band-frequency characteristics imparted to the tuning device 13 by parallel-resonant circuits, such as the circuit 33, 34, having different inductance-to-capacitance $$\left(\frac{L}{C}\right)$$

ratios. More particularly, curves A–F, inclusive, represent pass-band-frequency characteristics which individually correspond to the following values of $m_p$:

| | |
|---|---|
| Curve A | $m_p$= .33 |
| Curve B | $m_p$= .5 |
| Curve C | $m_p$= 1 |
| Curve D | $m_p$= 2 |
| Curve E | $m_p$= 5 |
| Curve F | $m_p$=10 |

where $$m_p=\frac{R_{31}}{\sqrt{\frac{L_{33}}{C_{34}}}} \quad (6)$$

For convenience, the curves are shown on a log-log scale having ordinates which represent the width of the pass band in terms of $$\frac{w}{\frac{4\pi d^2 Z_0 f_p^3}{nv^2 R_{31}}}$$

where $$\frac{4\pi d^2 Z_0 f_p^3}{nv^2 R_{31}}$$

remains constant as the operating frequency of the device changes. The abscissas represent the operating frequency of the tuning device in terms of $$\frac{f}{f_p}$$

where $f_p$ remains constant as the operating frequency of the device changes.

The curves may be utilized in proportioning the inductor 33 and the condenser 34 in a manner presently to be explained. To facilitate the explanation it will be assumed that the tuning device 13 has the following typical circuit constants:

$v=3\times10^{10}$ cm./sec.
$Z_0$=125 ohms
$R_{31}$=300 ohms
$n=½$
Selected frequency range =700–1000 mc.

It will further be assumed that a pass band having a width $w$ of 10 megacycles±10% is desired for the device 13, when the antenna system 10, 11 is substantially decoupled from the transmission line 14, 15. Then the inductor 33 and the condenser 34 must be so proportioned that the width of the pass band of the device does not exceed 11 megacycles and is not less than 9 megacycles over the selected frequency range. The width of the pass band, therefore, must vary less than 22.2% of minimum allowable width of 9 megacycles over the selected frequency range. It will be seen that the selected frequency range corresponds to an operating frequency range of 43% of the lowest frequency in the range. Thus, it is desired to select a pass-band-frequency characteristic for the device 13 such that over the selected frequency range of 43% of the lowest frequency in the range the width of the pass band of the device varies less than 22.2% of the minimum allowable width.

From a measurement of curves D, E and F it can be shown that where $m_p$ is greater than unity, the width of the pass band varies more than 22.2% of the minimum allowable width over any frequency range of 43% of the lowest frequency in the range. For example, over a frequency range of 43% of the lowest frequency in the range, which may be represented in terms of $$\frac{f}{f_p}$$

as extending from .60 to .86, the width of the pass band expressed in terms of $$\frac{w}{\frac{4\pi d^2 Z_0 f_p^3}{nv^2 R_{31}}}$$

varies about 36% of the minimum value of .175 to a maximum value of .238 as represented by curve D. It will also be seen from curves A, B and C that where $m_p$ is equal to or less than unity, the width of the pass band over a selected frequency range of 43% of the lowest frequency in the range varies less than 22.2% of the minimum allowable width. For instance, over a frequency range of 43% of the lowest frequency in the range, which may be represented in terms of $$\frac{f}{f_p}$$

as extending from .54 to .77, the width of the pass band expressed in terms of $$\frac{w}{\frac{4\pi d^2 Z_0 f_p^3}{nv^2 R_{31}}}$$

varies about 20% of the minimum value of .10 to a maximum value of .12 as represented by curve C. Similarly, it will be seen from curve B that by representing the frequency range of 43% of the lowest frequency in the range as extending from .47 to .67, the width of the pass band varies about 12% of the minimum value of .043 to a maximum value of .048. Accordingly, where $m_p$ is equal to or less than unity, over a selected frequency range of 43% of the lowest frequency in the range the width of the pass band of the device varies less than 22.2% of the minimum width. Accordingly, any parallel-resonant circuit which will provide for the impedance network a value of $m_p$ not greater than unity may be utilized to reduce variations in the width of the pass band of the device over the selected frequency range to less than ±10% of the nominal width of 10 megacycles. The circuit utilized, therefore, cannot have such a small $$\frac{L}{C}$$

ratio as to cause the value of $m_p$ to be greater than unity. The maximum value of the $$\frac{L}{C}$$

ratio will be determined by practical limitations involved in constructing a suitable inductor 33 for the device. If too small a value of $m_p$ is selected, it may not be feasible to construct an inductor having a sufficiently large $$\frac{L}{C}$$

ratio to provide the desired value of $m_p$. Accordingly, it will ordinarily be desirable to proportion a parallel-resonant circuit which provides about the maximum allowable value of $m_p$ for the impedance network.

In the example being considered, therefore, the value of $m_p$ may be selected as being unity and curve C may be selected as representing the pass-band-frequency characteristic to be provided for the device 13. The maximum frequency in the selected frequency range in terms of $$\frac{f}{f_p}$$

may then be expressed as follows:

$$\frac{f}{f_p}=.77 \qquad (7)$$

The maximum frequency of the selected frequency range was specified above as being 1000 megacycles. Hence, from Equation 7 it will be seen that:

$$f_p=1300 \text{ mc.} \qquad (8)$$

Since the value of $m_p$ has been selected as being unity it will be seen from Equation 6 that:

$$\frac{R_{31}}{\sqrt{\frac{L_{33}}{C_{34}}}}=1 \qquad (9)$$

As stated above:

$$R_{31}=300 \text{ ohms} \qquad (10)$$

Accordingly, from Equations 8, 9 and 10 it will be seen that:

$$L_{33}=.036\ \mu\text{h.} \qquad (11)$$

$$C_{34}=.4\ \mu\mu\text{f.} \qquad (12)$$

To determine the distance $d$ between the impedance network and the conductor 27 of the Fig. 1 embodiment, the maximum width of the pass band of the device 13, using a parallel-resonant circuit including an inductor and condenser having the values specified above, will be seen in Fig. 2 as being .12. Accordingly:

$$\frac{w}{\frac{4\pi d^2 Z_0 f_p^3}{nv^2 R_{31}}}=.12 \qquad (13)$$

By substituting the various circuit constants, the selected value of $f_p$ and the maximum allowable width $w$ of 11 megacycles per second into Equation 13, it will be seen that:

$$d=1.9 \text{ cm.} \qquad (14)$$

Accordingly, the parallel-resonant circuit comprising the inductor 33 and the condenser 34 may be proportioned and positioned in the manner described to impart to the device 13 a pass band having a substantially constant width over the selected frequency range. It will be understood that after the inductor 33 and the condenser 34 have been proportioned and positioned as described, the coupling loop 12 preferably is more tightly coupled to the transmission line 14, 15 to provide an impedance match between the antenna system 10, 11 and the crystal mixer 31 over the selected frequency range.

For some applications it may be desirable to utilize a series-resonant circuit in lieu of a parallel-resonant circuit to reduce variations in the width of the pass band of the device 13. Referring now to Fig. 3 of the drawings, curves G–N, inclusive, represent pass-band-frequency characteristics imparted to the device 13 by series-resonant circuits having different $$\frac{L}{C}$$

ratios. More particularly, curves G–N, inclusive, represent pass-band-frequency characteristics which individually correspond to the following values of $m_s$:

| | |
|---|---|
| Curve G | $m_s$=.10 |
| Curve H | $m_s$=.20 |
| Curve I | $m_s$=.25 |
| Curve J | $m_s$=.33 |
| Curve K | $m_s$=.40 |
| Curve L | $m_s$=.48 |
| Curve M | $m_s$=.55 |
| Curve N | $m_s$=.67 |

where:

$$m_s=\frac{R_{31}}{\sqrt{\frac{L_{33}}{C_e}}} \qquad (15)$$

Curves G–N, inclusive, are shown on a log-log scale having ordinates which represent the width of the pass band in terms of:

$$\frac{w}{\frac{4\pi d^2 Z_0 f_s^3}{nv^2 R_{31}}}$$

where:

$$\frac{4\pi d^2 Z_0 f_s^3}{nv^2 R_{31}}$$

remains constant as the operating frequency of the device 13 changes. The abscissas represent the operating frequency of the device 13 in terms of $$\frac{f}{f_s}$$

where $f_s$ remains constant as the operating frequency of the device changes.

Although the curves of Fig. 3 are of generally different shape from the curves represented in Fig. 2, they may be utilized in a manner similar to that explained in connection with the proportioning of the parallel-resonant circuit. It will be seen that considering the curves of Fig. 3 as a group, only small variations in the width of the pass band over a selected frequency range corresponding to 43% of the lowest frequency in the band occur between the abscissas 1.65 and 2.35 and it will also be seen that over this frequency range curve M represents the characteristic having the least variation in the width of the pass band.

By selecting a pass-band-frequency characteristic which represents an allowable variation in the width of the pass band over the selected frequency range, the values of inductance and capacitance and the distance between the impedance network and the conductor 27 may be determined in a manner similar to that explained in connection with the proportioning of the parallel-resonant circuit. A further explanation of the proportioning is deemed unnecessary. It will be seen that additional curves for both Figs. 2 and 3 may readily be derived from Equations 4 and 5, respectively, or by interpolation between the curves shown.

While applicant does not wish to be limited to any particular circuit constants, the following have been employed in a tuning device constructed in accordance with the invention utilizing a parallel-resonant circuit proportioned and positioned as explained above:

| | |
|---|---|
| Condensers **32** and **35** | 30 micromicrofarads. |
| Inductor **33** | .03 microhenry (approx.). |
| Condenser **34** (distributed capacitance of inductor **33**). | 0.7 micromicrofarad (approx.). |
| Condensers **37** and **38** | 2 micromicrofarads (max.). |
| Crystal mixer **31** | 300 ohms (approx.) (Type G7 General Electric germanium crystal). |
| Resistor **28** | 100 ohms (approx.). |
| Characteristic impedance of transmission line **14, 15.** | 125 ohms (approx.). |
| Tuning range of device **13** | 475–750 megacycles. |
| Length of transmission line **14, 15.** | About 10 inches. |
| Width of conductors **14** and **15** | About ⅜ inch. |
| Thickness of conductors **14** and **15.** | About ¹⁄₁₆ inch. |
| Distance between conductors **14** and **15.** | 1⅛ inches (center-to-center). |
| Distance between conductor **27** and crystal mixer **31.** | About ⅝ inch. |
| Distance between conductor **27** and condenser **37.** | About 1¼ inches. |
| Distance between conductor **27** and condenser **38.** | About 4 inches |
| Travel of tuning means **29** | About 4 inches. |
| D. C. component of rectified current flow through crystal mixer **31.** | About 2 milliamperes. |

From the foregoing description of the invention, it will be apparent that the tuning device 13 embodying the invention has the advantage that the parallel-resonant circuit comprising the inductor 33 and the condenser 34 can substantially reduce variations in the width of the pass band of the device over the selected frequency range.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A high-frequency wave-signal tuning device tunable to each of a plurality of frequencies in a selected range of frequencies comprising: a transmission line having an effective electrical length approximately equal to an integral multiple of one-quarter wave length at a predetermined frequency in said range; adjustable tuning means for selectively adjusting at each position thereof the effective electrical length of said transmission line to substantially said multiple of one-quarter wave length at one of said plurality of frequencies in said range; means coupled to said transmission line for applying a received wave signal thereto; means coupled to said transmission line for applying a heterodyne wave signal thereto; and an impedance network coupled to said transmission line at an intermediate point thereof and including a primarily resistive mixer and a resonant circuit additional to said transmission line and having a substantial primarily inductive impedance over at least a portion of said range, said resonant circuit being proportioned with relation to the impedance of said mixer substantially to reduce percentage variations in the width of the pass band of the device over said selected frequency range.

2. A high-frequency wave-signal tuning device tunable to each of a plurality of frequencies in a selected range of frequencies comprising: a transmission line having an effective electrical length approximately equal to an integral multiple of one-quarter wave length at a predetermined frequency in said range; adjustable tuning means for selectively adjusting at each position thereof the effective electrical length of said transmission line to substantially said multiple of one-quarter wave length at one of said plurality of frequencies in said range; and a load impedance network coupled to said transmission line at an intermediate point thereof and including a primarily resistive first impedance means and a resonant circuit additional to said transmission line and having a substantial primarily inductive impedance over at least a portion of said range and said network being coupled across said line and included in the active portion of said transmission line over said entire range, said resonant circuit being proportioned with relation to said first impedance means substantially to reduce percentage variations in the width of the pass band of the device over said selected frequency range.

3. A high-frequency wave-signal tuning device tunable to each of a plurality of frequencies in a selected range of frequencies comprising: a transmission line having an effective electrical length approximately equal to an integral multiple of one-quarter wave length at a predetermined frequency in said range; adjustable tuning means for selectively adjusting at each position thereof the effective electrical length of said transmission line to substantially said multiple of one-quarter wave length at one of said plurality of frequencies in said range; and a load impedance network coupled to said transmission line at an intermediate point thereof and including a primarily resistive first impedance means and a resonant circuit additional to said transmission line and comprising a self-resonant inductor resonant at a frequency above said selected range and having a substantial primarily inductive impedance over at least a portion of said range and said network being coupled across said line and included in the active portion of said transmission line over said entire range, said resonant circuit being proportioned with relation to said first impedance means substantially to reduce percentage variations in the width of the pass band of the device over said selected frequency range.

4. A high-frequency wave-signal tuning device tunable to each of a plurality of frequencies in a selected range of frequencies comprising: a transmission line having an effective electrical length approximately equal to an integral multiple of one-quarter wave length at a predetermined frequency in said range; adjustable tuning means for selectively adjusting at each position thereof the effective electrical length of said transmission line to substantially said multiple of one-quarter wave length at one of said plurality of frequencies in said range; and a load impedance network coupled to said transmission line at an intermediate point thereof and including a primarily resistive first impedance means and a series-resonant circuit additional to said transmission line and resonant at a frequency below said range and having a substantial primarily inductive impedance over at least a portion of said range and said network being coupled across said line and included in the active portion of said transmission line over said entire range, said resonant circuit being proportioned with relation to said first impedance means substantially to reduce percentage variations in the width of the pass band of the device over said selected frequency range.

5. A high-frequency wave-signal tuning device tunable to each of a plurality of frequencies in a selected range of frequencies comprising: a transmission line having an effective electrical length approximately equal to one-half wave length at the lowest frequency in said range and having a low-impedance termination at one end thereof; adjustable tuning means effective to provide a low-impedance termination for said transmission line and displaceable longitudinally thereof for selectively adjusting at each position of said tuning means the effective electrical length of said transmission line to substantially one-half wave length at one of said plurality of frequencies in said range; means coupled to said transmission line for applying a received wave signal thereto; means coupled to said transmission line for applying a heterodyning wave signal thereto; and a load circuit coupled to said transmission line at an intermediate point thereof and including a crystal mixer, an inductor having distributed capacitance effectively coupled in a parallel relation therewith to form a parallel resonant circuit and having a substantial inductive reactance at each of the plurality of frequencies in said range, and a condenser for deriving a resultant output signal from said applied signals, said inductor being so proportioned with relation to the impedance of said crystal mixer that said device has a pass band having a substantially constant width over said selected frequency range.

6. A high-frequency wave-signal tuning device tunable over a selected frequency range comprising: a high-frequency wave-signal transmission line; means for tuning said transmission line over a selected frequency range; primarily resistive load impedance means coupled to said transmission line at frequencies in said selected range; and primarily inductive impedance means, a resonant circuit additional to said transmission line and coupled to said line and to said load impedance means and having a substantial primarily inductive impedance over said range for decreasing the coupling of said load impedance means to said transmission line at the higher frequencies of said range substantially to reduce percentage variations in the width of the pass band of the device over said selected frequency range.

References Cited in the file of this patent

UNITED STATES PATENTS

| | | |
|---|---|---|
| 2,260,844 | Thomas | Oct. 28, 1941 |
| 2,427,107 | Landon | Sept. 9, 1947 |
| 2,441,452 | Strutt et al. | May 11, 1948 |
| 2,513,761 | Tyson | July 4, 1950 |
| 2,561,417 | Ryan et al. | July 24, 1951 |
| 2,611,858 | Samuelson | Sept. 23, 1952 |
| 2,627,579 | Wasmansdorff | Feb. 3, 1953 |
| 2,661,459 | Schmidt | Dec. 1, 1953 |